United States Patent [19]

Roohparvar

[11] Patent Number: 6,127,841
[45] Date of Patent: *Oct. 3, 2000

[54] CMOS BUFFER HAVING STABLE THRESHOLD VOLTAGE

[75] Inventor: Frankie F. Roohparvar, Cupertino, Calif.

[73] Assignee: Micron Technology, Inc., Boise, Id.

[*] Notice: This patent is subject to a terminal disclaimer.

[21] Appl. No.: 09/276,342

[22] Filed: Mar. 25, 1999

Related U.S. Application Data

[63] Continuation of application No. 08/929,209, Sep. 9, 1997, which is a continuation of application No. 08/493,166, Jun. 21, 1995, Pat. No. 5,668,483.

[51] Int. Cl.[7] ...................... H03K 17/16; H03K 19/0185
[52] U.S. Cl. .................... 326/34; 326/58; 326/81
[58] Field of Search ..................... 326/31–34, 80–81, 326/58, 83

[56] References Cited

U.S. PATENT DOCUMENTS

| | | | |
|---|---|---|---|
| 5,214,320 | 5/1993 | Truong | 326/33 |
| 5,355,033 | 10/1994 | Jang | 326/33 |
| 5,376,843 | 12/1994 | Tien et al. | 326/68 |
| 5,408,191 | 4/1995 | Han et al. | 326/33 |
| 5,428,303 | 6/1995 | Pasqualini | 326/31 |
| 5,493,235 | 2/1996 | Khayat | 326/34 |
| 5,668,483 | 9/1997 | Roohparvar | 326/34 |
| 5,731,713 | 3/1998 | Proebsting et al. | 326/81 |
| 5,900,741 | 5/1999 | Roohparvar | 326/34 |

*Primary Examiner*—Jon Santamauro
*Attorney, Agent, or Firm*—Schwegman, Lundberg, Woessner & Kluth, P.A.

[57] ABSTRACT

A CMOS buffer circuit having a trip point which is insensitive to variations in temperature, supply voltages and manufacturing processes. The circuit output stage has three series-connected MOS transistors including an N channel pull-down transistor connected between the buffer output and the circuit common, a first P channel pull-up transistor connected to a positive supply voltage and a second P channel pull-up transistor connected between the first P channel transistor and the buffer output. The gates of the first P channel transistor and the N channel transistor are connected together to form the buffer input. An N channel reference transistor is used to generate a reference current which is mirrored into the output stage by a third P channel transistor which is connected to the second P channel transistor of the output stage so as to form a current mirror. Circuitry is provided to bias the reference transistor in the same manner that the N channel transistor is biased when the buffer input and output are at a predetermined trip point. Thus, the N channel transistor will cause the buffer circuit to trip at the predetermined trip point notwithstanding variations in the power supply voltage, temperature and processing.

19 Claims, 2 Drawing Sheets

6,127,841

CMOS BUFFER HAVING STABLE THRESHOLD VOLTAGE

This application is a continuation of U.S. Ser. No. 08/929,209 filed Sep. 9, 1997 which is a continuation of U.S. Ser. No. 08/493,166 filed Jun. 21, 1995 which issued as U.S. Pat. No. 5,668,483 on Sep. 16, 1997.

FIELD OF THE INVENTION

The present invention relates generally to buffer circuits and in particular to CMOS buffer circuits having a trip point voltage which is stable with respect to power supply variations, process variations and changes in operating temperature.

BACKGROUND OF THE INVENTION

Referring to the drawings, FIG. 1 shows a conventional CMOS buffer circuit generally designated by the numeral 10. The two transistor circuit includes a P channel MOS pull-up transistor 12 having a source connected to a positive supply voltage Vcc and a drain connected to the buffer circuit output. Circuit 10 also includes an N channel MOS pull-down transistor 14 having a drain also connected to the output and a source connected to the system ground Vss. The gates of the two transistors 12 and 14 are connected in common to the circuit input.

The buffer circuit is designed to respond to a predetermined range of input voltages Vin and produce output voltage Vout which fall within a predetermined range. By way of example, in many applications a CMOS buffer must be capable of operating with input and output voltages which are compatible with TTL logic levels. In that case, the input voltage Vin must be at +0.8 volts or lower to provide a low logic level and +2.0 volts or more to provide a high logic level. In order to maximize the noise margin, the buffer 10 would normally be designed to have a trip point midway between these levels, namely 1.4 volts. The term trip point as used here means the point at the input voltage Vin is equal to the output voltage Vout.

The shortcomings of the conventional buffer 10 of FIG. 1 are best illustrated by briefly describing the operation of the buffer, with the input Vin starting at a logic low level and increasing to a logic high level. Transistors 12 and 14, like all MOS transistor, operate in one of three regions: (1) cut-off region, (2) linear region and (3) saturation region. The latter two regions are both commonly referred to as the active region, with the difference between the two depending primarily upon the magnitude of the drain-source voltage of the device.

Generally, an MOS device is in the saturation region and acts like a constant current source if the magnitude of the drain-source voltage is greater than or equal to the magnitude of the difference between the threshold voltage of the device and the gate-source voltage. Similarly, the device is generally in the linear region and acts like a resistance when the magnitude of the drain-source voltage is less than the magnitude of the difference between the threshold voltage and the gate-source voltage.

Assume initially that the input voltage Vin is at a low logic level, +0.8 volts for example, and the supply voltage Vcc is at a nominal +5 volts. Under these conditions, pull-down transistor 14 will be near the cut-off region (non-conductive) because the gate-source voltage of the device (+0.8 volts) is less than or very close to the threshold voltage of the device. Pull-up transistor 12 will be active since the gate-source voltage (+5 volts−+0.8 volts) is more than the threshold voltage of that device. Under these conditions, the output voltage Vout will be close to the supply voltage Vcc of +5 volts. Thus, the voltage drop across active transistor 12 will be small thereby indicating that the device is operating in the linear region.

As the input voltage increases and approaches the threshold voltage of pull-down transistor 14, transistor 14 will start to become conductive. The voltage across transistor 14 will still be large at this point so that the transistor will remain in the saturation mode (current source), as opposed to the linear mode (resistive). As transistor 14 starts to turn on, the output voltage Vout will begin to drop.

As the input voltage Vin increases further, and as the output voltage Vout decreases further, the voltage across the pull-up transistor 12 will increase causing the transistor to enter the saturation mode. Thus, both transistors 12 and 14 will be operating in the saturation mode, with each device demanding a particular current. Initially, the pull-down transistor 14 will dominate and require more current than can be supplied by the pull-up transistor 12. This will cause the output voltage to drop very rapidly, as is desired. As the voltage begins to equalize across the two transistor, both devices will be in a saturation mode and require essentially equal amounts of current. This is preferably at the trip point of the buffer where the input voltage Vin and output voltage Vout are equal and are at about +1.4 volts in the present example. As the input voltage Vin increases, the voltage across the pull-down transistor 14 tends to drop causing the device to change from the saturation mode to the linear mode. The output voltage will thus continue to drop, although at a slower rate than when both devices were saturated. The pull-up transistor 12 will remain in the saturation mode due to the relatively large voltage across this device.

Once the input voltage approaches +2.0 volts, the gate-source voltage of pull-up transistor 12 will approach −3.0 volts. Assuming that the threshold voltage of transistor 12 is −1 volt, the drain-to-source voltage is equal to the difference between the gate-to-source voltage and the threshold voltage of the transistor. This will cause transistor 12 to enter the linear region. At this stage the output resistance of transistor 12 is lowered substantially and will cause the voltage across the pull-down transistor 14 to be even lower.

As the gate voltage of transistor 14 approaches +4 volts, the transistor will enter linear operation as well when the difference between the input and the threshold voltage surpasses the output voltage. Finally, at +4 volts, transistor 12 will enter the cut-off region and the output will go all the way to 0 volts.

As can be seen from the foregoing, the operation of the conventional buffer 10 depends largely on the interaction between the pull-up and pull-down transistors 12 and 14 and the threshold voltage of the two devices. Further, as will be explained, the trip point of the buffer is a function of many variables, including the absolute value of the supply voltage Vcc, noise on the supply voltage, noise on the ground line, process variations and temperature changes.

In many applications, the input to a buffer may originate on another chip so that the input signal Vin does not necessarily vary with variations of supply voltage Vcc. Assume for example that voltage Vin is at the minimum logic high level of +2.0 volts. If the supply voltage Vcc were to increase to +6 volts, the gate-source voltage applied to pull-up transistor 12 would be +4 volts. Although this may not be sufficient alone to cause the buffer to incorrectly change states, a small amount of noise in input Vin or on the circuit ground may be sufficient. Similarly, pull-down transistor 14 may have a nominal threshold voltage of +0.7 volts. However, this voltage may change significantly due to process variations and due to temperature changes.

In addition, there is a significant amount of inductance present in the bonding wires or leads which connect the power pads on the chip to the pins of the chip package. In many applications, there are relatively large current transients through these inductances which result in large voltage transients on the power connections inside the chip. These transients are typically not even uniform throughout the chip itself. Thus, for example, if the input Vin were at +0.8 volts, and a transient was present which caused the ground voltage Vss to momentarily drop to −1.0 volts, the threshold voltage of transistor 14 would be exceeded and the device would turn on thereby resulting in an erroneous change in buffer output state.

Variations in trip point of a buffer or erroneous changes in state can result in very significant timing errors. This is particularly true in view of the fact that the buffer is frequently used as the first gate on a chip which receives signals external to the chip. For example, in high speed devices, a class of circuits is used that is commonly referred to as Address Transition Detection (ATD) circuits. If the output of a buffer driving an ATD were to change state as a result of noise being present on the supply line, for example, the ATD would incorrectly initiate a sequence of events in the chip. These events would disrupt operation of the chip thereby resulting in the creation of more noise and incorrect results.

The present invention relates to a buffer circuit which overcomes the above-noted shortcomings of conventional buffer circuits. The trip point of the subject buffer circuit can be precisely set and is immune to large amounts of noise present on the power supply and ground lines. Further, the trip point is stable with respect to process variations and with respect to temperature variations.

These and other advantages of the present invention will be apparent to those skilled in the art upon a reading of the following Detailed Description of the Invention together with the drawings.

SUMMARY OF THE INVENTION

A CMOS buffer circuit is disclosed having a trip point which is relatively constant notwithstanding changes in operating voltage, operating temperature and variations in processing. The buffer circuit includes first and second power busses, with the first and second power busses preferably being used for connection to the circuit common and a positive supply voltage, respectively. A first MOS transistor of a first polarity, preferably N channel, is provided having its source coupled to the first power bus and its drain coupled to the buffer circuit output.

The buffer circuit further includes second and third MOS transistors of a second polarity, preferably P channel, with the second device having its source coupled to the second power bus and its drain coupled to the source of the third device. The gate of the second device is connected to gate of the first device so as to form the buffer circuit input. The drain of the third device is coupled to the buffer output circuit. Alternatively, the third transistor can be connected between the second transistor and the second power bus. In that event, the common drains of the first and second transistors are connected to the buffer circuit input.

The buffer circuit further includes reference means for generating a first reference current and a fourth MOS transistor which is preferably a P channel device. The fourth device is coupled to the third device so as to form a current mirror. Preferably, the current mirror causes the reference current to be mirrored in the third device and in the first device when the buffer circuit is changing from one state to another. The reference means preferably includes a fifth MOS N channel device which produces the reference current and which is biased with the same voltages which appear on the first MOS device when the buffer is switching states. Thus, the trip point of the buffer is relatively fixed and is independent of power supply variations and the like.

DETAILED DESCRIPTION OF THE INVENTION

Figure 1:
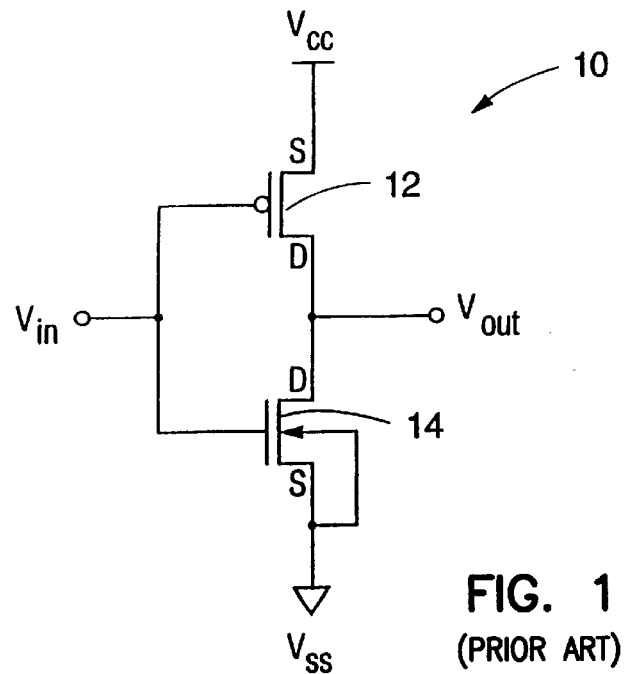
FIG. 1 is a schematic diagram of a conventional CMOS buffer circuit.
Figure 2:
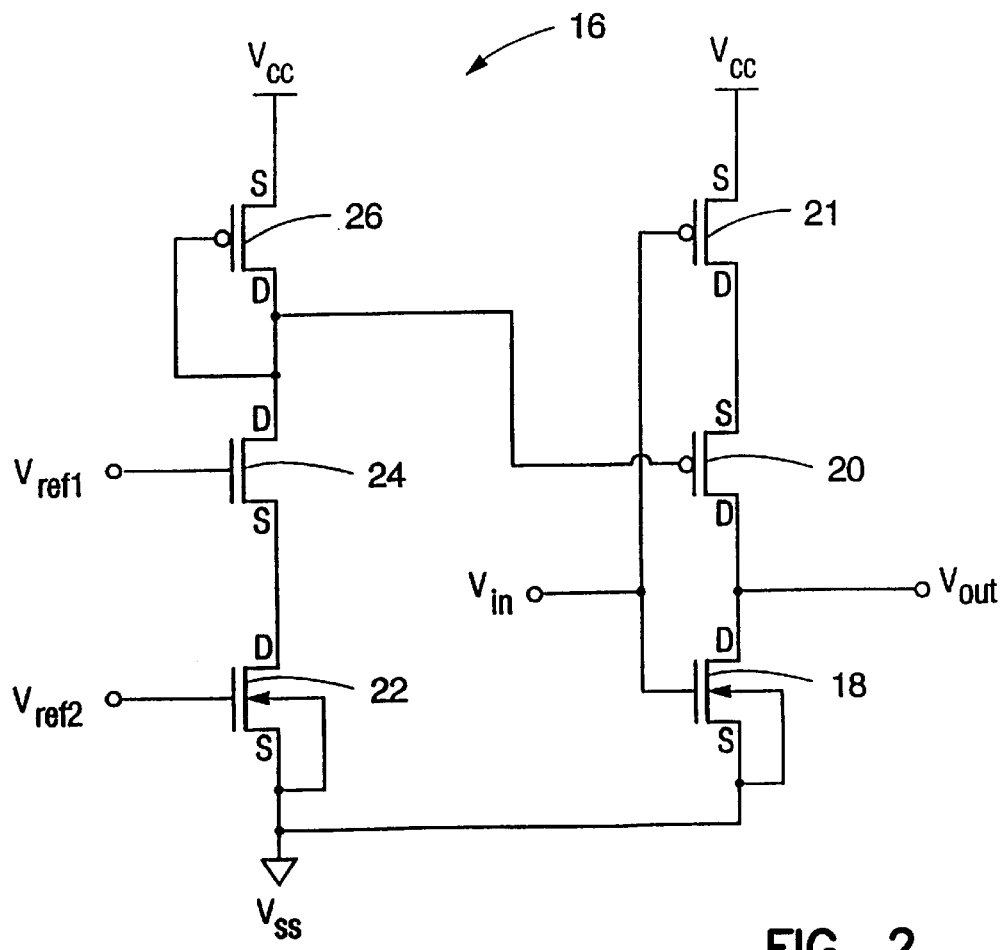
FIG. 2 is a schematic diagram of a first embodiment of a CMOS buffer circuit in accordance with the present invention.

Referring again to the drawings, FIG. 2 is a schematic diagram of a first embodiment of the present invention. The disclosed buffer circuit, generally designated by the numeral 16, includes an N channel MOS device 18 having a source connected to the circuit common Vss and a drain connected to the buffer output. In addition, the circuit 16 includes a P channel MOS device 20 also having a drain connected to the buffer output where Vout is produced. The source of transistor 20 is connected to the drain of a second P channel MOS device 21, with the source of device 21 being connected to the supply voltage Vcc. The gates of transistors 18 and 21 are connected together to form the buffer input which receives the input signal Vin. The three transistors 18, 20 and 21 are thus connected in series and form a main stage of the subject buffer circuit 16.

Buffer circuit 16 also includes a biasing stage which includes three transistors 22, 24 and 26 connected in series. Transistor 22, sometimes referred to as the reference transistor, is an N channel MOS device with a source connected to the system ground Vss and a drain connected to the source of a second N channel MOS device 24. The drain of transistor 24 is connected to the drain of a P channel MOS transistor 26, with the source of transistor 26 connected to the supply voltage Vcc.

The gates of transistors 22 and 24 are connected to reference voltages Vref2 and Vref1, respectively. Preferably, voltage Vref1 is generated by a precision temperature compensated voltage reference circuit such as a band gap reference, Blauschild reference or similar type of well known circuit which provides an output voltage which is relatively independent of variations in fabrication processing and in power supply voltages. Also, reference voltage Vref2 is generated from Vref1 by way of a voltage divider or the like. Assuming that the desired trip point of buffer is, by way of example, +1.4 volts, voltage Vref2 is set to +1.4 volts and voltage Vref1 is set to Vref2 (+1.4 volts) plus $V_{TN}$ (+0.7), the threshold voltage of the N channel transistors of the circuit. In addition, the gate of transistor 26 is connected to the drain of the transistor and to the gate of transistor 20 in the main stage of the buffer 16.

Transistor 24 is connected as a source follower and functions to apply a voltage to the drain of transistor 22 which will be the same as the voltage of the drain of transistor 18 when the buffer is at the selected trip point. Thus, if the selected trip point is +1.4 volts, both Vin and Vout, by definition, will be at +1.4 volts. Accordingly, transistor 24 is sized so that, when the gate of the transistor is at voltage Vref2 (the sum of Vref1 and $V_{TN}$), the source of transistor 24 and the drain of the reference transistor 22 are at +1.4 volts.

In operation, reference transistor 22 is biased to produce a reference current through it which is selected to match the desired current through transistor 18 when the buffer 16 input Vin and output Vout are both at the selected trip point of +1.4 volts. Transistors 18 and 22 should be matched as closely as possible and should be positioned adjacent one another on the chip so as to reduce any variations between the two devices due to temperature differentials and due to processing. In addition, the two transistors should contact the circuit common Vss at the same point so that any perturbations on the line will be affect both devices in the same manner.

The current flow through the reference transistor 22 flows through transistor 26 which functions as the input side of a current mirror. As will be explained, when the input Vin is a logic low, transistor 21 can be considered a short circuit so that the gate-source voltage of transistor 26 is effectively applied to the gate-source of transistor 20. Transistors 20 and 26 are matched and are located adjacent one another so that current flow in transistor 26 will be mirrored in transistor 20.

If it is assumed that the input voltage Vin is at +0.8 volts, the maximum logic low voltage, transistor 18 will be near the cut-off region and transistors 21 and 20 will be in the linear region due to the small drain-source voltage present across the two devices. Thus, output Vout will be at a logic high level approaching supply voltage Vcc. As the input voltage Vin increases, the output Vout continues to drop, with transistor 18 going from a near cut-off state to the saturated state. The voltage across transistors 21 and 20 will still be relatively small so that they both will be in the linear region at this point.

Once the input voltage Vin approaches the trip voltage of +1.4 volts, the output Vout is also approaching +1.4 volts. In addition, the magnitude of the current flow through transistor 18 is approaching the fixed current which flows through the reference transistor 22. At this point, transistor 21 remains in the linear state and transistor 20 is in the saturated state so that transistor 20 behaves essentially as a current source, precisely mirroring the current flow through reference transistor 22. In addition, transistor 18 is in the saturation mode, but it is not capable of sinking all of the current that transistor 20 can provide. At this point, the output voltage Vout begins to drop very rapidly.

Eventually, the predetermined trip point will be reached and input voltage Vin together with input voltage Vout will be at +1.4 volts. In addition, the gate-source and drain-source voltages of transistors 18 and 22 will be the same and the current flow through transistors 18 and 22 will be the same. Thus, the current drawn by transistor 18 will match that provided by mirror transistor 20.

As the input voltage Vin is further increased above the trip point, transistor 18 will remain in saturation and will attempt to draw more current than current mirror transistor 20 can provide. The output Vout will thus continue to drop and transistor 21 will begin to cut-off thereby causing transistor 20 to cease to function as a current mirror. Transistor 18 will be in the linear state due to the small voltage across the device and the output Vout will drop to a voltage close to ground level.

It can be seen from the foregoing that the trip point of the buffer 16 is determined exclusively by the interaction between the magnitude of the current provided by current mirror transistor 20 and transistor 18. The threshold voltage of pull-up transistor 21 is not critical, with the only requirement of transistor 21 being that it be sufficiently large so as to be able to provide transistor 20 with sufficient current so that transistor 20 can function as a current mirror.

The relationship between the mirrored current provided by transistor 20 and transistor 18 is fixed and is relatively independent of supply voltages, process variations and temperature. For example, the magnitude of the current mirrored by transistor 20 is independent of the supply voltage. If voltage Vcc were to increase for example, the current drawn by the reference transistor would not change, particularly due to the presence of source follower transistor 24 which controls the voltage across the reference transistor 22. A change in supply voltage Vcc would also have no affect on the current mirrored by transistor 20, thus the trip point would remain constant.

Temperature variations will function to change the characteristics of reference transistor 22 and thus the current through the transistor. However, transistor 18 will be affected in the same manner. Further, the two transistors 26 and 20 that form the current mirror will be similarly affected so that the trip point will remain unchanged. The same will be true of process variations since any changes in processing that affects transistors 22 and 26 will affect transistors 18 and 20.

In the event there is a voltage transient on the circuit common Vss, both transistors 18 and 22 will be affected in the same manner since they are connected to the circuit common at the same point. Thus for example, if the circuit common Vss should momentarily increase due to a large current transient, the current drawn by the reference transistor will momentarily decrease. However, transistor 18 will experience a similar voltage transient so that a correspondingly smaller amount of current will be required by transistor 18 at the buffer trip point. Accordingly, the overall operation of the circuit is not altered.

Figure 3:
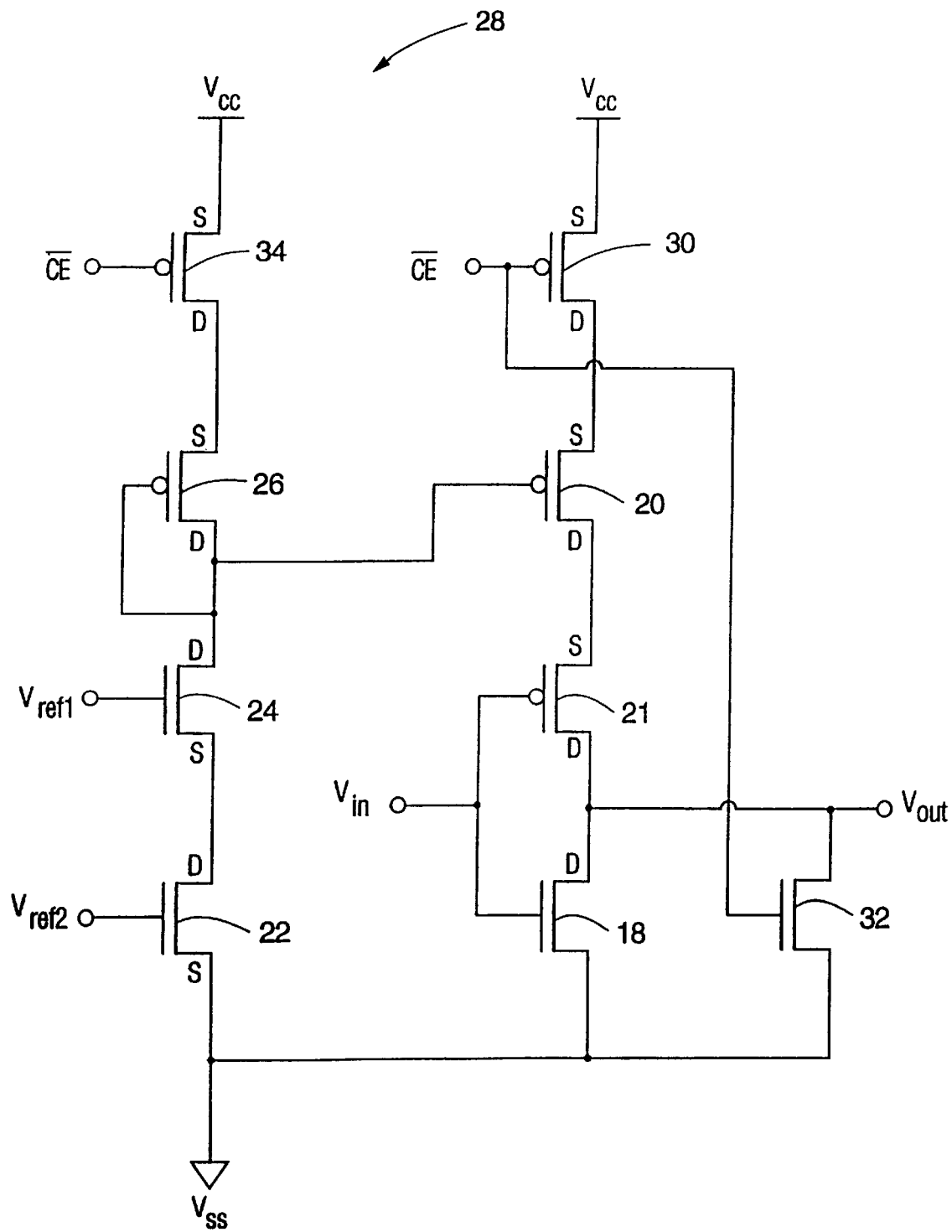
FIG. 3 is a schematic diagram of a second embodiment of a CMOS buffer circuit in accordance with the present invention.

FIG. 3 shows a second embodiment buffer circuit 28 which includes enable circuitry for enabling and disabling the circuit in response to a chip enable signal $\overline{CE}$ which is active low. The biasing stage is similar to that of the FIG. 2 embodiment with the addition of a P channel transistor 34. Transistor 34 is connected in series between P channel transistor 26 and the primary supply voltage Vcc. When the chip enable signal $\overline{CE}$ is active (low), transistor 34 is conductive so that the source of transistor 34 is effectively coupled to the primary supply voltage Vcc. Transistors 22, 24 and 26 of the biasing circuit then operate in the same manner as the corresponding transistors of the FIG. 2 embodiment. When signal $\overline{CE}$ is high transistor 34 is off and the biasing stage is disabled.

The output stage of the FIG. 3 embodiment includes four series connected transistors 18, 20, 21 and 30. Transistor 21 is a P channel transistor and transistor 18 is an N channel transistor, with their common drain connection forming the output of the circuit 28 and their common gate connection forming the input of the circuit.

P channel transistors 20 and 30 are series connected between the supply voltage Vcc and the source of transistor 21. The gate of transistor 20 is connected to the drain/gate of transistor 26. A further N channel transistor 32 is connected between the circuit output and the circuit common. The gates of transistors 30 and 32 are both connected to receive enable signal $\overline{CE}$. Thus, when signal $\overline{CE}$ is active (low), transistor 30 is conductive and transistor 32 is off. When inactive, the circuit output is pulled down to ground by the circuit common and transistor 20 is effectively disconnected from the supply voltage Vcc so that the circuit is disabled and draws no power.

In operation, signal $\overline{CE}$ is active so that the sources of transistors 26 and 20 are essentially at voltage Vcc. Operation is similar to that of the FIG. 2 embodiment in that a reference current is developed in transistor 22, the reference transistor, which is mirrored in transistor 20 under certain operating conditions. When the input voltage Vin is at a low level, transistor will be near the cut-off region and transistor 21 will be in the linear region. Thus, the output voltage Vout will be high. Transistors 20 and 21 will also both be in the linear region at this point. Thus, transistor 20 will not be functioning as a conventional current mirror at this point.

As the input voltage Vin approaches the trip point voltage of +1.4 volts, the output voltage Vout is also approaching that voltage. Transistor 18 will start to conduct a current approaching the reference current of transistor 22 in magnitude. Transistor 20 will eventually enter the saturation mode and function as a current mirror, precisely mirroring the reference current. At the trip point, both transistors 18 and 21 will be in saturation, momentarily conducting the reference current. The gain of circuit 28 will be high at this point so that, once the input voltage Vin slightly exceeds the trip point voltage, the output voltage Vout will go low.

Thus, two embodiments of a buffer circuit have been disclosed that have a stable trip point over a wide range of operating conditions. It should be noted that the term buffer circuit is used herein in a broad sense and is not limited to circuits that provide only unity gain. In addition, the term MOS transistor is used broadly herein and is intended to encompass all types of field effect transistors and is not meant to be limited to, for example, metal gate transistors. Further, although two embodiments of the invention has been described in some detail, one of ordinary skill in the art would understand that changes could be made without departing from the spirit and scope of the invention as defined by the appended claims. By way of example, the polarity of the MOS devices could be reversed together with the polarity of the supply voltages.

What is claimed is:

1. A circuit comprising:
    a buffer circuit comprising,
        an input connection to receive an input signal,
        an output connection to provide an output signal,
        a pull-down transistor coupled between the output connection and a first voltage supply connection,
        first and second series coupled pull-up transistors coupled between the output connection and a second voltage supply connection, gates of the pull-down transistor and the first pull-up transistor are coupled to the input connection; and
    a bias circuit having an intermediate output connection coupled to the buffer circuit, the bias circuit comprises, first and second bias transistors coupled between the intermediate output connection and the first voltage supply connection, a gate of the first bias transistor is coupled to receive a first bias voltage, and a gate of the second bias transistor is coupled to receive a second bias voltage, and
        a current mirror transistor coupled between the intermediate output connection and the first voltage supply connection.

2. The circuit of claim 1 wherein the pull-down transistor and the first and second bias transistors are n-channel transistors, and the first and second series coupled pull-up transistors and the current mirror transistor are p-channel.

3. The circuit of claim 1 further comprising enable circuitry to selectively disable the output signal.

4. The circuit of claim 3 wherein the enable circuitry comprises:
    a first enable transistor coupled in series with the first and second series coupled pull-up transistors;
    a second enable transistor coupled in series with the first and second bias transistors; and
    a third enable transistor coupled to the output connection, the first second and third enable transistors are selectively activated in response to an enable signal.

5. The circuit of claim 1 wherein the first bias voltage is equal to the second bias voltage plus a voltage substantially equal to a threshold voltage of the second bias transistor.

6. The circuit of claim 1 wherein the pull-down transistor and the second bias transistor are connected to the first voltage supply connection at a same physical location.

7. An integrated circuit comprising:
    a buffer circuit comprising,
        an input connection to receive an input signal,
        an output connection to provide an output signal,
        an n-channel pull-down transistor coupled between the output connection and a first voltage supply connection,
        first and second series coupled p-channel pull-up transistors coupled between the output connection and a first voltage supply connection, gates of the pull-down transistor and the first pull-up transistor are coupled to the input connection; and
    a bias circuit having an intermediate output connection coupled to the buffer circuit, the bias circuit comprises,
        first and second n-channel bias transistors coupled between the intermediate output connection and the first voltage supply connection, a gate of the first bias transistor is coupled to receive a first bias voltage, and a gate of the second bias transistor is coupled to receive a second bias voltage, and
        a p-channel current mirror transistor coupled between the intermediate output connection and the first voltage supply connection.

8. The integrated circuit of claim 7 further comprising enable circuitry to selectively disable the output signal.

9. The integrated circuit of claim 8 wherein the enable circuitry comprises:
    a first enable transistor coupled in series with the first and second series coupled pull-up transistors;
    a second enable transistor coupled in series with the first and second bias transistors; and
    a third enable transistor coupled to the output connection, the first second and third enable transistors are selectively activated in response to an enable signal.

10. The integrated circuit of claim 9 wherein the enable signal is an integrated circuit chip enable signal.

11. The integrated circuit of claim 7 wherein the first bias voltage is equal to the second bias voltage plus a voltage substantially equal to a threshold voltage of the second bias transistor.

12. The integrated circuit of claim 7 wherein the pull-down transistor and the second bias transistor are connected to the first voltage supply connection at a same physical location.

13. A circuit comprising:

a buffer circuit comprising,
- an input connection to receive an input signal,
- an output connection to provide an output signal,
- a pull-down transistor coupled between the output connection and a first voltage supply connection,
- a first enable transistor coupled to a second voltage supply connection,
- first and second series coupled pull-up transistors coupled between the output connection and the first enable transistor, gates of the pull-down transistor and the first pull-up transistor are coupled to the input connection,
- a second enable transistor coupled between the output connection and the first voltage supply connection; and a bias circuit having an intermediate output connection coupled to the buffer circuit, the bias circuit comprises,
- a third enable transistor coupled to the second voltage supply connection,
- first and second bias transistors coupled between the intermediate output connection and the third enable transistor, a gate of the first bias transistor is coupled to receive a first bias voltage, and a gate of the second bias transistor is coupled to receive a second bias voltage, the first second and third enable transistors are selectively activated in response to an enable signal, and
- a current mirror transistor coupled between the intermediate output connection and the first voltage supply connection.

14. The circuit of claim 13 wherein a trip point of the buffer circuit is approximately 1.4 volts.

15. The circuit of claim 13 wherein the enable signal is an integrated circuit chip enable signal.

16. The circuit of claim 13 wherein the pull-down transistor and the second bias transistor are connected to the first voltage supply connection at a same physical location.

17. A circuit comprising:

a buffer circuit comprising,
- an input connection to receive an input signal,
- an output connection to provide an output signal,
- an n-channel pull-down transistor coupled between the output connection and a first voltage supply connection,
- a first p-channel enable transistor coupled to a second voltage supply connection,
- first and second series coupled p-channel pull-up transistors coupled between the output connection and the first enable transistor, gates of the pull-down transistor and the first pull-up transistor are coupled to the input connection,
- a second p-channel enable transistor coupled between the output connection and the first voltage supply connection; and a bias circuit having an intermediate output connection coupled to the buffer circuit, the bias circuit comprises,
- a third p-channel enable transistor coupled to the second voltage supply connection,
- first and second n-channel bias transistors coupled between the intermediate output connection and the third enable transistor, a gate of the first bias transistor is coupled to receive a first bias voltage, and a gate of the second bias transistor is coupled to receive a second bias voltage, the first second and third enable transistors are selectively activated in response to an enable signal, and
- a current mirror p-channel transistor coupled between the intermediate output connection and the first voltage supply connection.

18. The circuit of claim 17 wherein the pull-down transistor and the second bias transistor are connected to the first voltage supply connection at a same physical location.

19. The circuit of claim 17 wherein the first bias voltage is equal to the second bias voltage plus a voltage substantially equal to a threshold voltage of the second bias transistor.

* * * * *